United States Patent [19]

Borodovsky et al.

[11] Patent Number: 4,672,420
[45] Date of Patent: Jun. 9, 1987

[54] INTEGRATED CIRCUIT STRUCTURE HAVING CONDUCTIVE, PROTECTIVE LAYER FOR MULTILAYER METALLIZATION TO PERMIT REWORKING

[75] Inventors: Yan Borodovsky, Fremont; Mammen Thomas; Danny Ma, both of San Jose, all of Calif.

[73] Assignee: Advanced Micro Devices, Inc., Sunnyvale, Calif.

[21] Appl. No.: 722,957

[22] Filed: Apr. 12, 1985

Related U.S. Application Data

[63] Continuation-in-part of Ser. No. 593,335, Mar. 26, 1984, Pat. No. 4,580,332.

[51] Int. Cl.[4] ..................... H01L 23/14; H01L 23/54
[52] U.S. Cl. ......................................... 357/71; 357/67; 357/61
[58] Field of Search .............. 357/67, 71, 61; 29/589, 29/590, 591

[56] References Cited

U.S. PATENT DOCUMENTS 3,385,731  5/1968  Weimer ................................. 357/61
4,267,012  5/1981  Pierce et al. .......................... 357/67

Primary Examiner—Andrew J. James
Assistant Examiner—S. V. Clark
Attorney, Agent, or Firm—Patrick T. King; John P. Taylor

[57] ABSTRACT

An improved integrated circuit structure, and method of making the structure, is disclosed wherein at least one metallization layer is coated during production of the structure with a conductive layer capable of withstanding metal removal means, and an upper metallization layer is subsequently applied to the structure. At least a portion of the subsequent metallization layer is in ohmic contact with the conductive layer and the lower metallization layer is protected by the intervening conductive layer during subsequent removal of the upper metallization layer if subsequent reworking of the structure becomes necessary. In a preferred embodiment, the use of the conductive layer over a metallization layer further enhances the construction process during patterning of a photoresist applied over the conductive layer by the use of a conductive material having antireflective properties.

6 Claims, 4 Drawing Figures

INTEGRATED CIRCUIT STRUCTURE HAVING CONDUCTIVE, PROTECTIVE LAYER FOR MULTILAYER METALLIZATION TO PERMIT REWORKING

CROSS REFERENCE TO RELATED APPLICATION

This application is a continuation-in-part of application Ser. No. 593,335 filed Mar. 26, 1984 and now issued as U.S. Pat. No. 4,580,332 on Apr. 8, 1986.

BACKGROUND OF THE INVENTION

1. Field of the Invention

This invention relates to the production of integrated circuit devices. More particularly, this invention relates to an integrated circuit structure having a conductive layer which may be placed in betweeen metallization layers to permit subsequent selective removal of the overlying metallization layer, if necessary, for rework.

2. Description of the Prior Art

During construction of an integrated circuit device, it would sometimes be desirable to rework the structure due to some mistake or error in an upper layer. Reworking, rather than scrapping the wafer, would be economically desirable when a number of correctly constructed lower layers have already been applied beneath the problem layer. However, when two or more metallization layers are already present in the structure and the two layers are in electrical contact with one another due to openings or vias which have already been made through intervening layers, selective removal of the upper metal layer, for example, by etching, without damage to the lower metallization layer, can be difficult and complicated.

For example, Cynkar et al U.S. Pat. No. 4,415,606 describes a process for reworking the upper level metal layer by first forming a photoresist mask to mask the vias leading to the lower metal layer followed by etching of the upper metal layer to remove the unmasked portions of the layer including the defects.

When the lower metallization layer is damaged in attempting to remove the upper metallization layer, removal of the intervening oxide layers is necessitated as well. However, since the etchants which would be used to remove intermediate oxides would also remove lower oxide portions in underlying transistor structures formed in the silicon wafer, the wafer, in essence, cannot, in such instances, usually be reworked and must be scrapped.

There, therefore, exists a need for a construction which will permit the necessary electrical connection between two or more metallization layers without interfering or inhibiting the subsequent removal of the outermost of the layers if it later becomes necessary to rework the structure.

SUMMARY OF THE INvENTION

It is therefore an object of the invention to provide an improved integrated circuit structure and a method for making the structure wherein a conductive member, resistant to means for removing metal, is applied between two metallization layers which will permit subsequent selective removal of the upper metallization layer without disturbance to the lower metallization layer.

It is another object of the invention to provide an improved integrated circuit structure and a method for making the structure wherein a conductive member, resistant to means for removing metal, is applied between two metallization layers which will provide a conductive path between the metallization layers without introducing any substantially added resistance between the metallization layers through the conductive path.

It is yet another object of the invention to provide an improved integrated circuit structure and a method for making the structure wherein a conductive member, resistant to means for removing metal, is applied between two metallization layers which will protect the lower metallization layer during subsequent selective removal of the upper metallization layer.

It is a further object of the invention to provide an improved integrated circuit structure and a method for making the structure wherein a conductive member, resistant to means for removing metal, is applied between two metallization layers which will protect the lower metallization layer, during a subsequent selective removal of the upper metallization layer, from etchant means used to remove the upper metallization layer.

It is yet a further object of the invention to provide an improved integrated circuit structure and a method for making the structure wherein a conductive member, resistant to means for removing metal, is applied between two metallization layers which will enhance the process of forming further layers over the conductive layer as well as permit subsequent selective removal of the upper metallization layer, if necessary, without disturbance to the lower metallization layer by protecting the lower metallization layer from etchant means used to remove the upper metallization layer.

These and other objects of the invention will be apparent from the accompanying drawings and description.

In accordance with the invention, an improved integrated circuit structure, and method of making the structure, is provided which comprises at least one metallization layer having applied thereon during production of the structure a conductive layer resistant to means for removing metal and an upper metallization layer subsequently applied to the structure over the conductive layer wherein at least a portion of the subsequent metallization layer is in ohmic contact with the conductive layer whereby the lower metallization layer is protected by the intervening conductive layer during subsequent removal of the upper metallization layer if subsequent reworking of the structure becomes necessary.

In a preferred embodiment, the conductive layer also functions as an antireflective coating, and the use of the conductive layer over a metallization layer, therefore, further enhances the construction process by the use of its antireflective properties during patterning of a photoresist applied over the conductive layer.

DESCRIPTION OF THE PREFERRED EMBODIMENTS

Figure 1:
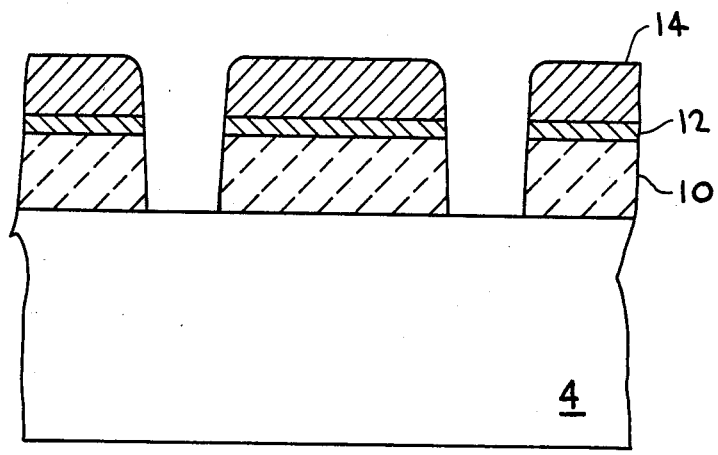
FIG. 1 is a cross-sectional view of an integrated circuit structure in an intermediate stage of construction showing the conductive layer applied over a first metallization layer.
Figure 2:
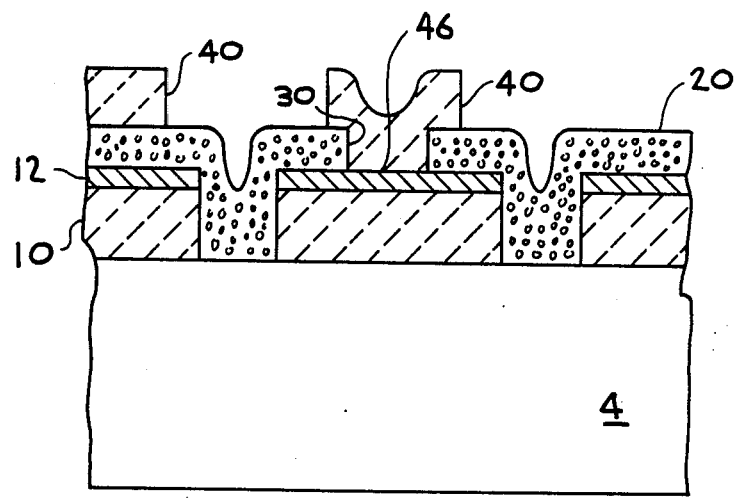
FIG. 2 is a cross-sectional view illustrating the structure shown in FIG. 1 after removal of photoresist and deposition of a subsequent oxide layer and a second metallization layer.
Figure 3:
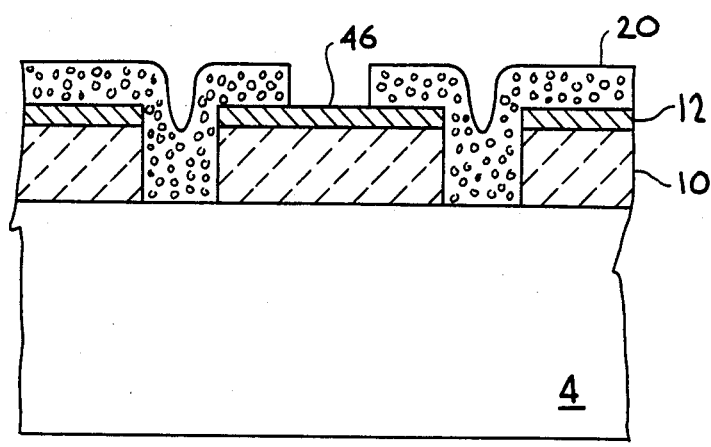
FIG. 3 is a cross-sectional view of the structure shown in FIG. 2 after the second metallization layer has been removed.

Referring now to FIGS. 1-3, the invention will be illustrated in a simplified form. In FIG. 1, an intermediate stage of manufacturing of an integrated circuit is shown. A metallization layer 10 which may, for example, comprise aluminum is shown applied over an underlying structure 4. A layer 12 of a conductive material has been applied over metallization layer 10, for example, by sputtering to a thickness of at least 500 Angstroms. A layer 14 of photosensitive material or "photoresist" is then applied over the conductive layer and exposed to a pattern of light through a mask. The photoresist is then developed to remove the exposed portions, and the underlying segments of the conductive layer and metallization layer so uncovered are removed.

Conductive layer 12 may comprise materials, such as, for example, indium arsenide and titaniumtungsten. In accordance with the invention, the material used for conductive layer 12 must possess good conductivity and must be resistant to means, such as an etchant, used for removal of a metallization layer subsequently applied over the conductive layer. This permits subsequent removal, for reworking purposes, of a metallization layer placed over conductive layer 12 without disturbance to the underlying metallization layer 10. For example, indium arsenide will withstand a wet etchant, such as an acid etch, capable of removing an underlying metallization layer, such as an aluminum layer, while a titanium-tungsten layer will withstand a plasma etch used to remove such an aluminum layer.

By way of illustration only, the invention will now be described using an indium arsenide coating for conductive layer 12 which is removable by wet etching techniques.

The indium arsenide segments may be removed by treating the indium arsenide with a solution comprising 1 volume part bromine in 100 volume parts acetic acid and 100 volume parts water. The now exposed aluminum is then etched away by conventional wet or dry etching techniques such as, for example, a 20% aqueous KOH solution at 65° C.

As shown in FIG. 2, an oxide layer 20 may then be applied and then patterned to open a contact 30. A second metallization layer 40, such as another layer of aluminum, is then deposited and patterned. The necessary interconnection or vias between the first and second metallization layers are supplied through the openings in the oxide layer therebetween to provide a contact at 46 between layer 40 and the underlying indium arsenide 12. This, in turn, provides the desired conductive path between first metallization layer 10 and second metallization layer 40. As shown in FIG. 2, metallization layer 40 may also be patterned for application of subsequent layers of the integrated circuit structure.

During the various construction steps which may occur after application of second metallization layer 40, an error may occur, such as an improperly aligned patterning or overetching, etc., which necessitates reworking including removal of such upper layers (as an alternate to scrapping of the wafer) including metallization layer 40. Previously, this would have presented a problem because of the direct connection between metallization layers 10 and 40.

In accordance with the invention, however, as illustrated in FIG. 3, layer 40 may be removed with a chemical etch, such as KOH, which will not attack the indium arsenide layer overlying first metallization layer 10 at contact point 46. Thus, first metallization layer 10 is protected from the etchant by the presence of intervening indium arsenide layer 12.

While metallization layers 10 and 40 have been illustrated as comprising aluminum because of its common usage in the industry, other materials including aluminum alloys and polysilicon may also be used in place of aluminum without any loss in the advantages provided by the invention. The use of the term "metallization" herein is therefore defined as including not only metals, but other materials as well which, either naturally or because of doping, have a conductivity approaching that of a metal conductor.

Similarly, wet etchants other than the illustrated KOH may be used to selectively remove an upper metallization layer without attacking the underlying conductive layer including acids, such as, for example, mineral acids, such as nitric or hydrochloric acid. When acids are use, and particularly mineral acids, it is preferable to etch at about room temperature to avoid damage to other materials on the wafer.

When a conductive material, such as titanium-tungsten, is used for conductive layer 12 the use of a plasma etch using chlorine chemistry, i.e., $SiCl_4$, $Cl_2$, or $BCl_3$, is preferred to remove second metallization layer 40 without removing or damaging underlying metallization layer 10. It should further be noted that, depending upon the type of integrated circuit structure, the use of a material resistant to plasma etching may be desirable in instances where anisotropic etching is preferred over wet etching to prevent attack of the underlying metal from the side rather than from the top. This is of particular value where the via may be misaligned to the underlying or lower metallization layer. It may also be preferred, in such instances to form the oxide over the lower metallization layer and to open the vias through the oxide to the lower metallization layer prior to placement of protective coating 12 thereon. This would compensate for the possibility of misalignment of the vias over the lower metallization layer.

The conductive layer should have a minimum thickness of about 500 to 700 Angstroms to provide a sufficient amount of protection chemically for the underlying metallization layer. Since indium arsenide has a resistivity of about 20 milliohms×centimeter, the thickness of the conductive layer, when using indium arsenide, should not exceed 10,000 Angstroms to avoid adding an undesirable amount of resistance to the interconnection of the underlying metallization layer through the indium arsenide layer to the upper metallization layer. When using other materials, the maximum thickness may differ depending upon the resistivity of the material used. For example, when using metals such as titanium-tungsten for coating layer 12, the maximum thickness is not so limited because of the use of a metal, rather than a semiconductor. Preferably, however, even when using titanium-tungsten, the thickness of coating layer 12 should be about 700 to 2000 angstroms.

In a preferred embodiment, the use of conductive materials, such as indium arsenide or titanium-tungsten over a metallization layer has an additional advantage due to the antireflective or light absorptive properties of these materials. Thus, patterning of a photoresist layer applied over a metallization layer having a coating of conductive materials thereon having antireflective properties, such as indium arsenide or titanium-tungsten, can be done more accurately because of the reduction of the amount of light reflected back into the photoresist due to the presence of the antireflective conductive layer. To make maximum use of this property, however, the conductive coating should be applied to the lower metallization layer prior to the formation of oxide over the metallization layer and prior to via formation.

Figure 4:
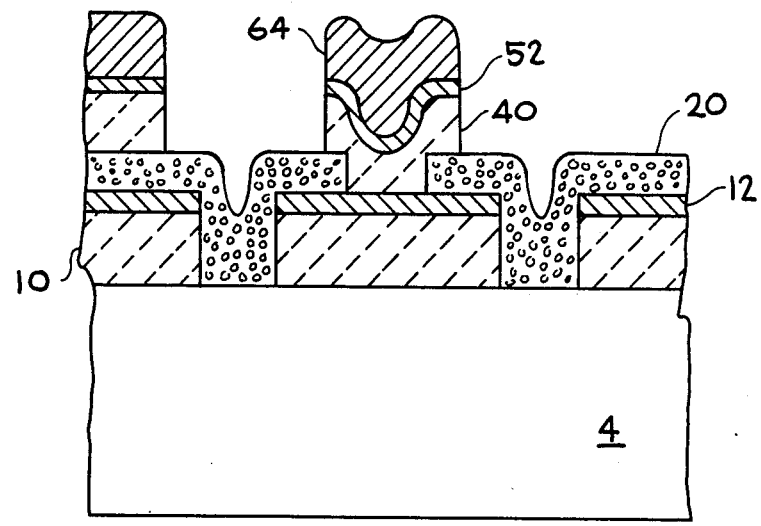
FIG. 4 is a cross-sectional view illustrating the structure shown in FIG. 2 with a conductive layer applied to the second metallization layer in preparation for subsequent application of a third metallization layer.

It should be further noted that the use of a conductive layer over a metallization layer need not be limited to a single layer. As shown in FIG. 4, second metallization layer 40 may also have a conductive layer 52 thereon in contemplation of subsequent application of a third metallization layer 40 over conductive layer 52. As shown in FIG. 4, a further photoresist layer 64 has already been applied and selectively developed over second conductive layer 52 in contemplation of the deposition of further integrated circuit layers including one or more further metallization layers.

Thus, the invention provides an improved integrated circuit structure and method of making the structure wherein the inclusion of a conductive layer over a metallization layer provides electrical coupling to an upper metallization layer while isolating the two metallization layers to permit selective removal of the upper metallization layer without disturbance of the lower metallization layer thus permitting economical reworking of a defective wafer which may not have been possible heretofore in many instances.

Having thus described the invention, what is claimed is:

1. An improved integrated circuit structure comprising:
   (a) a first metallization layer;
   (b) a conductive layer of indium arsenide on said first metallization layer, said conductive indium arsenide layer being capable of withstanding means for removing a metallization layer; and
   (c) an upper metallization layer applied over said conductive indium arsenide layer and in ohmic contact with said conductive indium arsenide layer to provide a conductive path between said first and upper metallization layers;

whereby said first metallization layer, while connected to said upper metallization layer by said conductive path, is protected by the intervening indium arsenide conductive layer if subsequent reworking of the structure including removal of said second metallization layer becomes necessary.

2. The structure of claim 1 wherein said conductive indium arsenide layer is resistant to at least one wet etchant capable of removing a metallization layer.

3. The structure of claim 2 wherein said conductive layer comprises an indium arsenide layer capable of withstanding a wet etchant used to remove said upper metallization layer upon subsequent reworking of said structure.

4. An improved integrated circuit structure comprises at least one lower metallization layer having a conductive indium arsenide layer applied to the upper surface thereof during production of the structure and an upper metallization layer subsequently applied to the structure wherein at least a portion of the subsequently applied upper metallization layer is in ohmic contact with the conductive indium arsenide layer whereby the lower metallization layer is protected by the intervening indium arsenide layer during subsequent removal of the upper metallization layer if subsequent reworking of the structure becomes necessary.

5. The structure of claim 4 wherein a plurality of metallization layers each have an indium arsenide layer applied thereto to provide electrically conductive protective barriers between adjacent portions of metallization layers applied over said conductive layers.

6. The structure of claim 2 wherein said conductive indium arsenide layer on said first metallization layer has a thickness of at least 500 Angstroms to provide adequate protection to said first metallization layer against said wet etchant capable of removing a metallization layer.

* * * * *